US007093208B2

(12) United States Patent
Williams et al.

(10) Patent No.: US 7,093,208 B2
(45) Date of Patent: Aug. 15, 2006

(54) METHOD FOR TUNING A DIGITAL DESIGN FOR SYNTHESIZED RANDOM LOGIC CIRCUIT MACROS IN A CONTINUOUS DESIGN SPACE WITH OPTIONAL INSERTION OF MULTIPLE THRESHOLD VOLTAGE DEVICES

(75) Inventors: Patrick M. Williams, Poughkeepsie, NY (US); Ee K. Cho, Poughkeepsie, NY (US); David J. Hathaway, Underhill, VT (US); Mei-Ting Hsu, Poughquag, NY (US); Lawrence K. Lange, Wappingers Falls, NY (US); Gregory A. Northrop, Putnam Valley, NY (US); Chandramouli Visweswariah, Croton-on-Hudson, NY (US); Cindy ShuiKing Washburn, Poughquag, NY (US); Jun Zhou, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 160 days.

(21) Appl. No.: 10/842,589

(22) Filed: May 10, 2004

(65) Prior Publication Data
US 2004/0230924 A1 Nov. 18, 2004

Related U.S. Application Data

(63) Continuation-in-part of application No. 10/436,213, filed on May 12, 2003, now Pat. No. 7,010,763, and a continuation-in-part of application No. 10/435,824, filed on May 12, 2003, now Pat. No. 7,003,747.

(51) Int. Cl.
*G06F 17/50* (2006.01)
(52) U.S. Cl. ............... 716/3; 716/1; 716/2; 716/4; 716/6; 716/10; 716/18; 365/149; 703/14

(58) Field of Classification Search ............... 716/4, 716/1, 2, 6, 10, 18; 365/149; 703/14
See application file for complete search history.

(56) References Cited

U.S. PATENT DOCUMENTS 4,827,428 A * 5/1989 Dunlop et al. ............... 716/6

(Continued)

OTHER PUBLICATIONS

G. A. Northrop et al., A Semi-Custom Design Flow in High-Performance Microprocessor Design, Proc. 2001 Design Automation Conference, Las Vegas, Nevada, pp. 426-431, Jun. 2001.*

(Continued)

*Primary Examiner*—A. M. Thompson
*Assistant Examiner*—Nelson Lam
(74) *Attorney, Agent, or Firm*—Lynn L. Augspurger

(57) ABSTRACT

A Digital Design Method which may be automated is for obtaining timing closure in the design of large, complex, high-performance digital integrated circuits. The method includes the use of a tuner on random logic macros that adjusts transistor sizes in a continuous domain. To accommodate this tuning, logic gates are mapped to parameterized cells for the tuning and then back to fixed gates after the tuning. Tuning is constrained in such a way as to minimize "binning errors" when the design is mapped back to fixed cells. Further, the critical sections of the circuit are marked in order to make the optimization more effective and to fit within the problem-size constraints of the tuner. A specially formulated objective function is employed during the tuning to promote faster global timing convergence, despite possibly incorrect initial timing budgets. The specially formulated objective function targets all paths that are failing timing, with appropriate weighting, rather than just targeting the most critical path. Finally, the addition of multiple threshold voltage gates allows for increased performance while limiting leakage power.

17 Claims, 5 Drawing Sheets

U.S. PATENT DOCUMENTS

| | | | |
|---|---|---|---|
| 5,392,221 A * | 2/1995 | Donath et al. | 716/6 |
| 5,508,937 A * | 4/1996 | Abato et al. | 716/6 |
| 6,202,192 B1 * | 3/2001 | Donath et al. | 716/6 |
| 6,460,166 B1 * | 10/2002 | Reddy et al. | 716/2 |
| 6,557,151 B1 * | 4/2003 | Donath et al. | 716/6 |
| 6,574,779 B1 * | 6/2003 | Allen et al. | 716/1 |
| 6,701,289 B1 * | 3/2004 | Garnett et al. | 703/14 |
| 6,745,371 B1 * | 6/2004 | Konstadinidis et al. | 716/2 |
| 2003/0233628 A1 * | 12/2003 | Rana et al. | 716/18 |
| 2004/0196684 A1 * | 10/2004 | Katoh et al. | 365/149 |
| 2004/0230921 A1 * | 11/2004 | Hathaway et al. | 716/2 |
| 2004/0230929 A1 * | 11/2004 | Zhou et al. | 716/6 |
| 2005/0050497 A1 * | 3/2005 | Tetelbaum | 716/6 |
| 2005/0114814 A1 * | 5/2005 | Correale et al. | 716/10 |
| 2005/0114815 A1 * | 5/2005 | Correale et al. | 716/10 |

OTHER PUBLICATIONS

A. R. Conn et al., Gradient-Based Optimization of Custom Circuits Using a Static-Timing Formulation, Proc. 1999 Design Automation Conference, New Orleans, La., pp. 425-429, Jun. 1999.*

W. Liqiong et al., Design and Optimization of Low Voltage High Performance Dual Threshold CMOS Circuits, Proc. 1998 Design Automation Conference, San Fransisco, Ca., pp. 489-494, Jun. 1998.*

M. Ketkar et al., Standby Power Optimization via Transistor Sizing and Dual Threshold Voltage Assignment, Prof. International Conference on Computer-Aided Design (ICCAD), San Jose, Ca., pp. 375-378, Nov. 2002.*

* cited by examiner

METHOD FOR TUNING A DIGITAL DESIGN FOR SYNTHESIZED RANDOM LOGIC CIRCUIT MACROS IN A CONTINUOUS DESIGN SPACE WITH OPTIONAL INSERTION OF MULTIPLE THRESHOLD VOLTAGE DEVICES

CROSS-REFERENCE TO RELATED APPLICATIONS

This application is a continuation in part of these referenced patent applications and contains subject matter which is related to the subject matter of the following co-pending applications, each of which is assigned to the same assignee as this application, International Business Machines Corporation of Armonk, N.Y.. Each of the two patent applications from which priority is claimed are listed below and hereby incorporated herein by reference in its entirety:

D. J. Hathaway, L. K. Lange, C. Visweswariah and P. M. Williams, "Method of Optimizing and Analyzing Selected Portions of a Digital Integrated Circuit," U.S. patent application Ser. No. 10/436,213, filed on May 12, 2003, assigned to IBM, and issued Mar. 7, 2006 as U.S. Pat. No. 7,010,763.

D. J. Hathaway, C. Visweswariah, P. M. Williams, J. Zhou, "Method of Achieving Timing Closure in Digital Integrated Circuits by Optimizing individual Macros," U.S. Pat. application Ser. No. 10/435,824, filed on May 12, 2003, assigned to IBM, and issued Feb. 21, 2006 as U.S. Pat. No. 7,003,747.

TRADEMARKS

IBM® is a registered trademark of International Business Machines Corporation, Armonk, N.Y., U.S.A. and other names used herein may be registered trademarks, trademarks or product names of International Business Machines Corporation or other companies.

BACKGROUND OF THE INVENTION

1. Field of the Invention

This invention relates to methods for tuning the digital design and design automation of high-performance digital integrated circuits. The invention particularly is directed to the problem of developing an integrated circuit design optimization methodology which exploits circuit tuning of individual macros. The tuning of individual macros is conducted by optimizing transistor sizes over a defined continuous design space. To further optimize for performance, circuits with low or high threshold voltage transistors are selectively substituted for regular threshold ones.

2. Description of Background

Typically the datapath and array design sections of a high-speed microprocessor design are logically well-defined. In addition, these circuit sections are typically custom-designed circuits which are electrically and physically designed much earlier in the design cycle to assure high clocking performance. The remaining sections of the design, the control logic sections, are often changed late in the microprocessor design cycle to reach required logical function but other objectives such as timing closure put an additional constraint on the system, making automated optimal design closure techniques extremely valuable. Automated techniques deliver several advantages such as improved circuit performance, higher quality and correctness, and enhanced time-to-market.

The control logic is contained in physical entities called random logic macros or RLMs, where the term random does not imply true randomness, but instead a lack of regular structure as is found in datapath and array circuitry. Due to the unstructured nature of the logic, synthesis and place/route tools are employed to read in a logical description and transform it into primitive logical gates. Hereafter the term gate is understood to include a collection of transistors which is to be treated as a single logical circuit element. These gates are adjusted in drive strength to achieve timing objectives and placed legally while a wiring tool routes the connections between these gates to complete the physical design.

Prior-art methods of circuit tuning towards timing closure are illustrated in FIG. 1 (flow 100) in the case of a "flat" design methodology and FIG. 2 (flow 200) in the case of a "hierarchical" design methodology. For the majority of semiconductor designs, FIG. 1 is typically employed where designs are analyzed and optimized in a flat representation. The flow starts with a logic design specification (labeled "Customer Logic Drop" in box 110) whereby a logic synthesis tool (box 120) synthesizes the input logic description into proper logical gates and structures to assure logical correctness. Logic restructuring of the gates (box 130) maps the logical gates into technology-approved gates required for manufacturing. An initial timing analysis of the design is typically applied whereby the gates are put through a process of powering up and down (box 140), depending on current drive needed to move towards cycle-time goals. This process continues with the physical design (box 150) which entails the physical placement of the gates and global routing of the design which is needed to provide a rough understanding of the real wiring of the design. The global routing provides parasitic extraction details which, along with the placed design, is provided as input to static timing analysis (box 160) to predict the performance of the current design. Many iterations of this process (box 160 to box 120) are attempted with different adjustments of the entire process to achieve timing closure. If cycle time or the physical constraints are not met via this process, the design may take on new engineering logic changes (box 170), and if so the design is started once again through the synthesis, placement, timing process as described (boxes 120–160). If no logic changes are required, the gates of the design are connected via routing, the electrical parasitics of the routing are extracted, and the design proceeds through a final static timing (box 180). Other checks are applied at this time but typically the design must be adjusted logically to achieve cycle time goals and the design is presented back to the synthesis, placement and timing process of boxes 120–160. Upon final acceptance of the design, it is sent to manufacturing (box 190).

The other prior-art methodology to achieve timing closure is illustrated in FIG. 2 (flow 200) and is usually implemented for more complex and dense semiconductor designs such as a microprocessor. This hierarchical methodology presents many benefits in the spirit of "divide and conquer." It permits a parallel approach to tackling the complexity of the design by enabling the design team to work on macro partitions of the overall design. Each macro partition has a space budget and a timing budget associated with it. Once the macro partition has been designed, its actual timing is represented as a timing abstract, which is a simplified representation of its salient overall timing characteristics. This method improves design turnaround time and time-to-market. It also permits an analysis of the performance of the chip at any stage of the design, substituting full timing abstract models for portions of the chips that have been designed for the estimated or budgeted timing models created during high-level design planning for the portions that haven't yet been designed.

The boxes on the left of FIG. 2 (boxes 205 to 230) pertain to a custom design flow. Custom design is typically applied to arithmetic or dataflow circuits, or other circuits requiring careful hand-design. The boxes on the right of FIG. 2 (boxes 235–265) pertain to a design flow for automatically synthesized and placed random logic macros. The boxes in the middle (boxes 270 to 290) pertain to the steps in the methodology that bring together the custom and random logic macros for global integration and timing of the chip. Thus flow 200 of FIG. 2 embodies two levels of timing closure: one at the individual macro level, and another at the global chip level. The following four paragraphs explain the three main sections of this prior-art hierarchical design methodology.

Functions like adders and arrays are typically implemented as custom macros. It is widely known that efficient implementations of such macros cannot be totally developed by automatic computer-aided design (CAD) software and that in-depth engineering is required in many steps to assure performance. Therefore a custom macro's logic architecture (box 205) is described but the architecture is restructured logically and modified by hand for optimal timing performance (box 210). A rough physical placement is constructed of the major building blocks (box 215) to estimate overall size and to minimize parasitic element constraints within the design. The schematic is developed with these constraints and static or dynamic timing analysis is performed (box 220) by employing a static timing analysis tool or circuit simulator, respectively. The macro design is physically engineered, parasitics are extracted and the design is timed again (box 225). As necessary, the processes of boxes 210 to 255 are iterated to improve the timing characteristics of the macro.

For the purposes of hierarchical analysis, a timing macro model, called a timing abstract (box 275), is produced. A timing abstract is a simplified model that represents the timing behavior of the entire macro. The timing abstract typically contains the timing behavior of timing arcs to and from macro boundary pins to latch points within the macro design. These timing abstracts are incorporated at the global level to enable the chip-level timing analysis (box 270) for the entire chip design. Timing assertions (box 230) or constraints are fed back and applied on the macro pins from the global timing analysis. These timing assertions when placed on the custom macro during timing analysis could result in the need for additional logic restructuring for timing optimization and the process is started again (box 225 back to box 210). To help speed this process it is extremely effective to produce the timing abstracts in the beginning of the design from the schematic timing analysis (dotted arrow from box 220 to box 275).

In parallel to the custom flow, the Random Logic Macro (RLM) flow starts with an initial logic specification (labeled "RLM Logic Drop" in box 235). This part of the flow is very similar to FIG. 1 (flow 100). The logic is synthesized (box 240), logic is restructured for technology adaptation (box 245), gates are powered up or down for required drive strengths (box 250), and the resulting netlist is physically designed (box 255) for minimal wire length on critical paths. Once completed, parasitic extraction and timing analysis is executed (box 260) on the design. Constraints are typically adjusted throughout this process and the loop is iterated many times (box 260 back to box 240) to produce optimal performance. As with custom designs, timing abstracts (box 275) for the RLMs are produced for global timing analysis. Timing assertions (box 265) are fed back to the RLM design loop as additional constraints on the design.

The third main component of flow 200 comprises of the boxes in the middle of FIG. 2 in which the various custom and RLM macros are integrated to obtain a final chip design. Global timing results (box 270) and new logic changes (box 280) would require either custom or RLM macros or both to be redesigned depending on the change required. Evaluation of a final timing run, physical design requirements and other checks (box 285) might also require a loop through either the custom or RLM flows. Until all checks and analysis are satisfied, the chip cannot be released for manufacturing (box 290).

The two described prior-art methodology flows have various strengths and weaknesses, which are discussed below. Analyzing a flat design as in FIG. 1 (flow 100), enables a small design team to close in on the cycle time quickly with the help of a fully automated chip development system. Typically the optimal cycle time for a given technology is not achieved due to the imperfections within this system including approximations made along the way and short cuts taken throughout the process to achieve a quick turnaround from the design system. Inaccuracies include, for example, the use of approximate timing models rather than transistor-level simulation. Short cuts include sub-optimal and heuristic optimization methods, a relatively small library to keep synthesis turn around time to a minimum and relatively simplistic modeling and optimization techniques. These limitations or imperfections force the system in FIG. 1 (flow 100) to iterate many times before a successful conclusion on the achievable performance. Detailed "cross-section analysis" of the worst case paths of the design is typically not conducted in such a flow.

A flat design flow as in FIG. 1 (flow 100) implies very large optimization problems with very large design spaces. Various commercial and in-house CAD (computer-aided design) tools have been developed to solve the optimization problems in this flow. Due to the large number of optimization variables and the discrete nature of these variables, heuristic methods have been favored in these optimization tools. The use of heuristic methods leads to a number of difficulties including problems in achieving performance, a large number of design iterations, incomplete exploitation of the technology, all of which lead to long design times and sub-optimal designs.

As digital designs become more complex and dense as in leading-edge microprocessors and SoCs (systems on a chip), FIG. 1 (flow 100) is insufficient to obtain timing closure and system objectives, hence a hierarchical methodology like that of FIG. 2 (flow 200) is applied. While FIG. 2 (flow 200) controls the design complexity with the use of macro partitions, timing closure must now be accounted for at two levels of the design, both locally within the macro and globally. Referring back to FIG. 2 (flow 200), the difficulty with this flow is the management of the timing budgets between macros and global connections. The process requires careful management of these budgets through the use of the wiring and buffering solutions of the global nets and careful logic implementation of the macro paths connecting between these global paths. Cycle time closure on the critical paths could require logic re-design to reduce overall delays of these timing paths. This redesign could effect connections at the global level and new solutions of wiring and buffering must be implemented. Therefore logic and circuit solutions at both the global and macro levels must be analyzed and developed to achieve optimum cycle time performance. Another potential problem is that typically only the top most critical path or paths are searched, broken down and analyzed for the required solution, but as soon as that is done, other sub-critical paths which were not exposed before may now be limiting. The procedure is therefore time-consuming and not guaranteed to produce a design that meets the required system-level performance.

Thus, the hierarchical design flow of FIG. 2 (flow 200) suffers from two main problems. The first is the difficulty of iteratively adjusting the budgets of the individual macros so as to meet global timing requirements, while giving individual macros reachable targets. The second is that focusing on just a few critical paths is not sufficient to meet overall timing and leads to a great deal of re-design.

As described in the previous two paragraphs, both flows limit the progression of the design due to the nature of the heuristic iterations that each flow applies and therefore retards the achievable circuit performance which can be obtained by the flows. This slow convergence rate towards cycle time objectives limits the flexibility of the design team to introduce functional and timing changes throughout the design process, and in particular during the crucial period late in the design cycle. In all cases, only a small sub-set of critical paths is exposed towards an optimal solution.

Modern technologies allow multiple threshold voltage transistors, whereby transistors with different threshold voltages can be integrated on the same chip. Low threshold voltage (Low Vt) transistors offer faster performance, but at the cost of increased leakage power. High threshold voltage (High Vt) transistors offer significant reduction in leakage power, but at the cost of lower performance. It is therefore beneficial to sparingly use Low Vt devices on the critical paths to achieve higher performance, but limit the usage of such devices to limit leakage power. It is also beneficial to use High Vt devices on the non-critical paths to reduce leakage power, but not to the extent that the non-critical paths slow down and turn into critical paths.

Physical synthesis CAD tools employ heuristic methods to introduce multiple threshold devices with the dual objectives of achieving higher performance and limiting leakage power. The prior-art heuristic methods limit the ability to optimally adjust the performance and leakage of the circuits.

The prior art therefore suffers from several problems and weaknesses as summarized below:
a) Prior art design flows generally require excessive iteration.
b) Prior art design flows focus on optimizing only the single or a very small subset of the most critical paths, which in turn leads to long design times and slow convergence towards cycle time objectives.
c) In prior art hierarchical flows, the interaction between imperfect budgeting across the hierarchy at the global level and imperfect optimization at the macro level can lead to poor circuit performance and excessive redesign effort.
d) Prior art flows do not include continuous optimization techniques during RLM design, despite the ability of such techniques to obtain optimal solutions. Further, prior-art flows do not include specialized techniques to deal with the relatively low capacity and high run times of such continuous optimization methods.

SUMMARY OF THE INVENTION

Disclosed is an efficient and effective methodology for obtaining timing closure in the design of large, complex, high-performance digital integrated circuits. The novel methodology includes the use of a tuner on random logic macros that adjusts transistor sizes in a continuous domain. To accommodate this tuning, logic gates are mapped to parameterized cells for the tuning process and then back to fixed gates after tuning. Tuning is constrained in such a way as to minimize "binning errors" when the design is mapped back to fixed cells. Further, the critical sections of the circuit are marked in order to make the optimization more effective and to fit within the problem-size constraints of the tuner. A specially formulated objective function is employed during the tuning to promote faster global timing convergence, despite possibly incorrect initial timing budgets. The specially formulated objective function targets all paths that are failing timing, with appropriate weighting, rather than just targeting the most critical path. Finally, the addition of multiple threshold voltage gates allows for increased performance while limiting leakage power.

These and other improvements are set forth in the following detailed description. For a better understanding of the invention with advantages and features, please refer to the detailed description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF THE INVENTION

Figure 1:
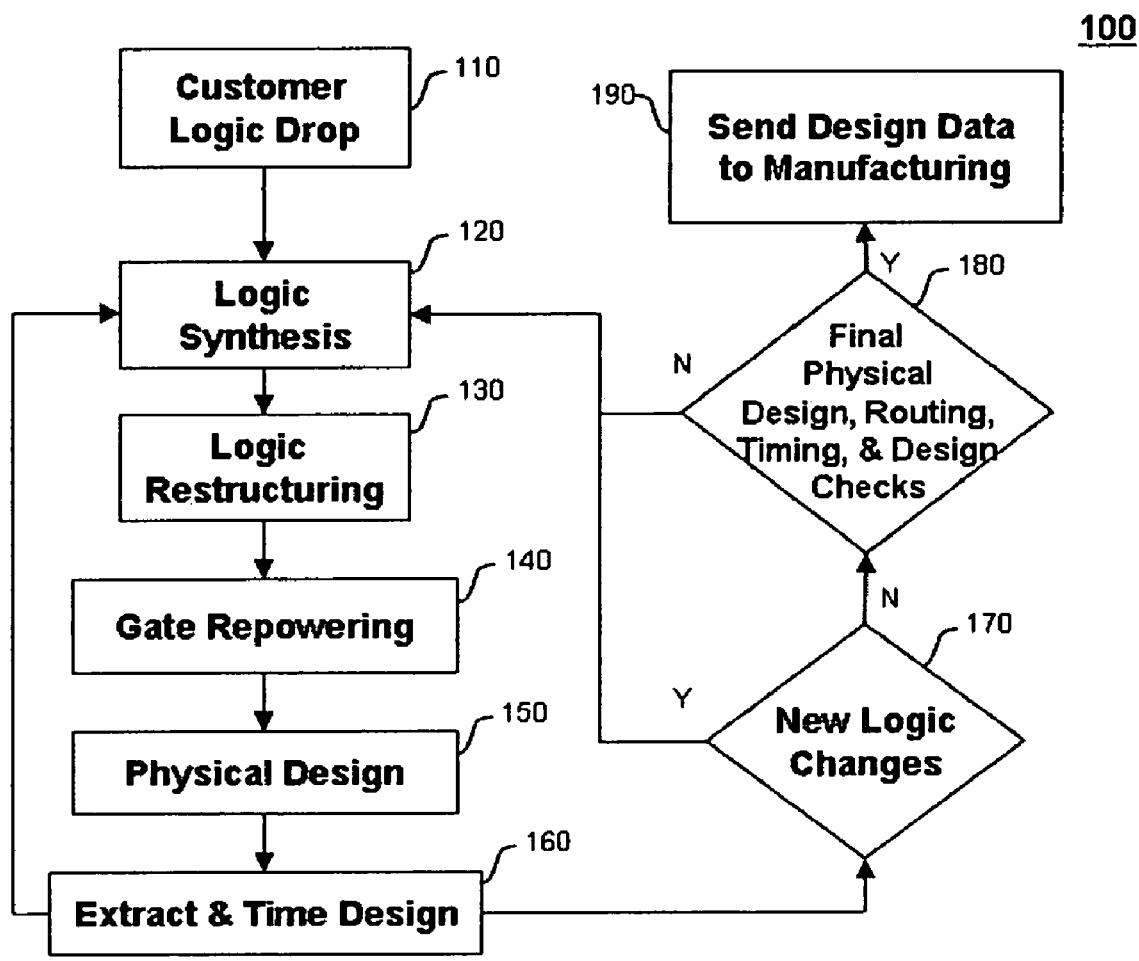
FIG. 1 illustrates a typical prior-art "flat methodology" iterative procedure for achieving timing closure of a typical semiconductor digital integrated circuit.
Figure 2:
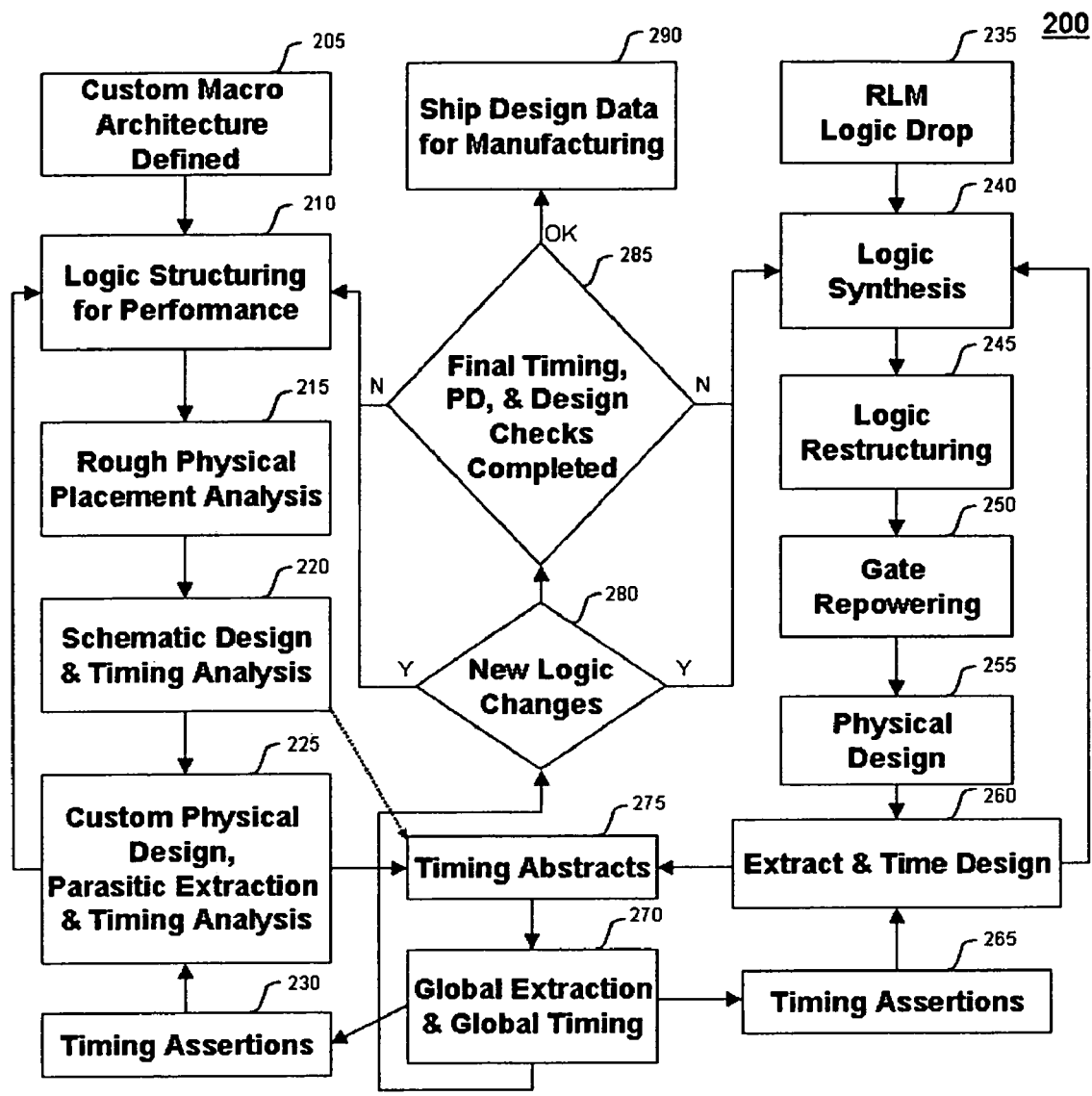
FIG. 2 illustrates a typical prior-art "hierarchical methodology" iterative procedure for achieving timing closure of a high-performance digital integrated circuit or functional unit of a high-performance digital integrated circuit.
Figure 3:
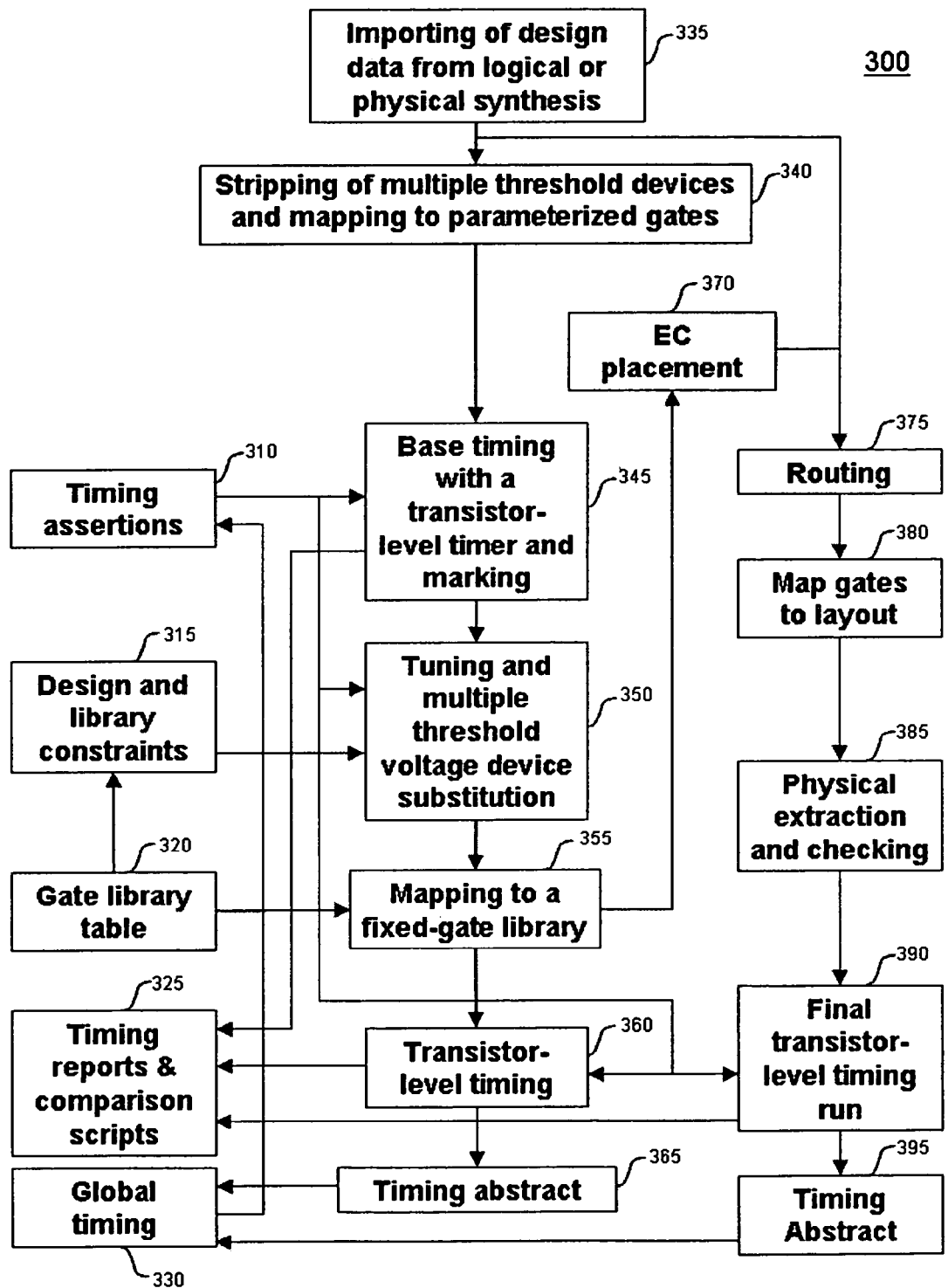
FIG. 3 illustrates the inventive methodology flow for the tuning of circuits within synthesized random logic macros with the optional substitution of multiple threshold voltage devices. For completeness, the figure also includes the final stages of routing, extraction and final timing.

An inventive design and optimization methodology for random logic macros (RLMs) is shown in FIG. 3 (flow 300). The salient features of the preferred components of this methodology and how they fit together are explained below.

Referring to FIG. 3, the first step is to import design data (box 335) that comes out of a logical or physical synthesis program, which is known to be logically correct. This design data is at the gate-level, i.e., it typically consists of a collection of logic gate primitives such as NAND gates, NOR gates, etc. These primitives are called "fixed cells" since they are available in fixed transistor size combinations in the library of logic gates. As will be described in detail below, the inventive methodology maps the fixed-cell gate-level design to an equivalent "parameterized cell" transistor-level design in order to apply sophisticated mathematical optimization techniques, and then finally returns the design to a fixed-cell gate-level description. A "parameterized cell" is a primitive cell which employs continuous variables for the strengths or widths of each transistor that makes up that cell, to be further described later.

Figure 4:
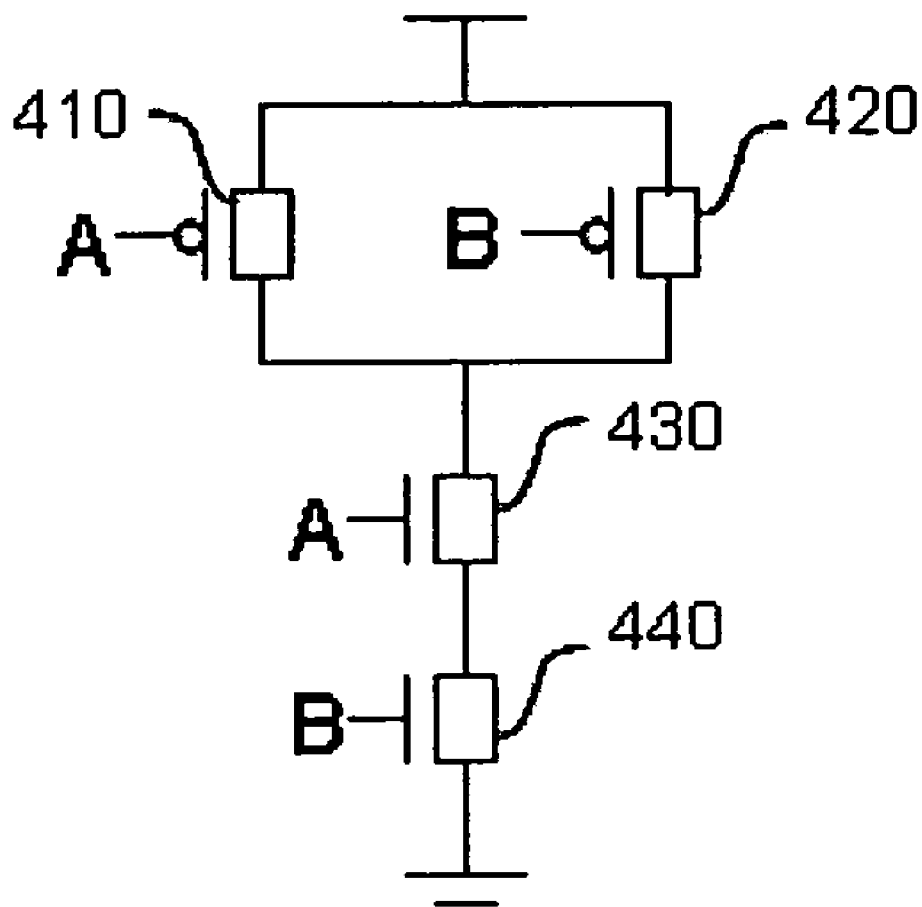
FIG. 4 illustrates the transistor-level schematic of a two-way NAND gate parameterized cell.
Figure 5:
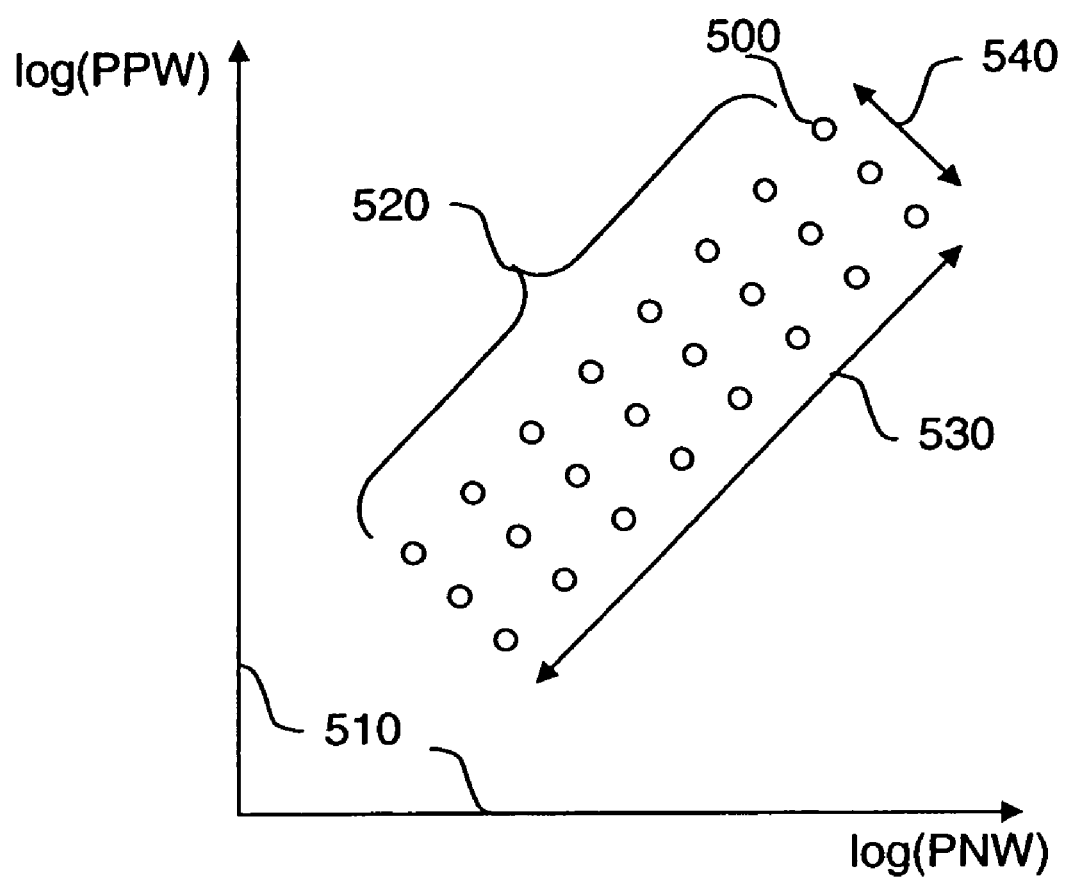
FIG. 5 illustrates a plot of PPW and PNW parameters of a set of predefined gates of a given function which may be mapped to a single parameterized cell.

The next step after importing the design is to strip any threshold voltage assignments and map the fixed-cell logic gates to parameterized gates (box 340). Since the identities of the timing-critical paths will change and are not known until later in the optimization flow, it is not advantageous to accept the threshold voltage assignments suggested by the logical or physical synthesis program. Instead, all transistors are set to a "regular" or "normal" threshold voltage for the particular technology at hand, where the "regular" threshold voltage is chosen among a plurality of choices available in the implementation technology as one which provides a good trade-off between leakage current and performance on typical logic paths in the design. Next, the logic gates are mapped to members of a parameterized library [see G. A. Northrop and P-F. Lu, "A semi-custom design flow in high-performance microprocessor design," Proc. 2001 Design Automation Conference, Las Vegas, Nev., June 2001, pages 426–431]. A parameterized cell is "in-between" a fixed-cell with no transistor-size flexibility and a full-custom cell in which the width of each transistor can be adjusted arbitrarily and independently. In parameterized cells, the PFETs are typically "grouped," i.e., they are all controlled by one parameter called PPW in the sequel. Likewise, all the NFETs are controlled by one parameter called PNW. Thus a 3-input NAND gate has 6 transistors, but is parameterized by just two variables: PPW and PNW. Referring to FIG. 4, schematic 400 is of a two-way NAND gate parameterized cell comprising PFETs 410 and 420 and NFETs 430 and 440. Parameter PPW for this cell controls the widths of PFETs 410 and 420, forcing the ratio between their widths (typically 1/1) to remain constant. Similarly, parameter PNW for this cell controls the widths of NFETs 430 and 440, forcing the ratio between their widths to remain constant. Referring to FIG. 5, point 500 represents a particular fixed cell implementation of a function with PPW and PNW values determined by the location of the point with respect to plot axes 510. The collection of points 520 represents all available fixed cells for this function. Arrow 530 represents a direction of variation for parameters PPW and PNW corresponding to increasing or decreasing drive strength of the cell. Arrow 540 represents a direction of variation of parameters PPW and PNW corresponding to increasing or decreasing the beta ratio (the ratio between the PFET and NFET strengths of the gate). Parameterized cell libraries possess numerous advantages. For optimization purposes, the adoption of parameterized cells converts the problem from one of discrete optimization to a continuous optimization problem. Parameterized cells also give rise to optimization problems with fewer independent variables than full-custom library cells. By the addition of appropriate constraints in the continuous optimization problem (e.g., minimum and maximum value constraints on PNW or PPW, and minimum and maximum value constraints on PPW/PNW), the continuous optimization process may be forced to consider only solutions which fall close in both PPW and PNW values to one of the fixed cells in the library. Parameterized cells are also amenable to automated layout techniques [see G. A. Northrop and P-F. Lu, "A semi-custom design flow in high-performance microprocessor design," Proc. 2001 Design Automation Conference, Las Vegas, Nev., June 2001, pages 426–431] and therefore allow library design flows to be more automated with relatively small loss of performance compared to full-custom design.

Returning to FIG. 3, in the mapping step of box 340, each fixed cell of the original design is replaced by a parameterized cell of equivalent logical function, and PPW and PNW are chosen for each cell so as to match the original transistor sizes as closely as possible.

The next step (box 345) is to conduct a "baseline" timing of the circuit to determine its performance for comparison purposes later in the design flow. This baseline timing is typically performed by means of a transistor-level static timer [see V. B. Rao, J. P. Soreff, T. B. Brodnax and R. E. Mains, "EinsTLT: transistor-level timing with EinsTimer," Proc. TAU ACM/IEEE workshop on timing issues in the specification and synthesis of digital systems, Austin, Tex., December, 1999]. Other than the input design and technology models, one of the main inputs to the transistor-level timing program is a set of timing assertions (box 310), which provide the time at which input signals arrive, the time at which output signals are required, the external capacitive load driven by the outputs, and so on. The result of this timing step is a timing report (box 325) which is stored in a database for future comparison purposes.

One of the main goals of the inventive flow is to use continuous transistor-level optimization techniques to improve the performance of the circuit. Continuous transistor-level optimizers (called "tuners" in the sequel) use sophisticated mathematical techniques [see A. R. Conn, N. I. M. Gould and Ph. L. Toint, "LANCELOT: A Fortran package for large-scale nonlinear optimization (Release A)," Springer Verlag, 1992] to obtain an optimal solution to the transistor sizing problem [see A. R. Conn, I. M. Elfadel, W. W. Molzen Jr., P. R. O'Brien, P. N. Strenski, C. Visweswariah and C. B. Whan, "Gradient-based optimization of custom circuits using a static-timing formulation," Proc. 1999 Design Automation Conference, New Orleans, La., pages 425–429, June 1999]. As a result, they are able to gain tremendous performance improvement. Unfortunately, they typically cannot handle the large size of a random logic macro. Since it is impractical to tune the entire macro, a "marking" step is undertaken (box 345) mainly to reduce the size of the problem to a size that is practical for a tuner to tackle. If we are mainly interested in performance, since the performance is limited by the most critical paths, the marking step marks all parts of the circuit that are considered to have a chance of being timing-critical as "tunable" and the rest as "untunable" to reduce the size of the optimization problem which also includes latches and connecting clock circuitry. If we are also interested in reducing power or area, the least timing-critical sections could be marked tunable so that the optimizer can take advantage and reduce the area and power in these non-critical sections by downsizing transistors as appropriate. The co-pending application D. J. Hathaway, L. K. Lange, C. Visweswariah and P. M. Williams, "Method of Optimizing and Analyzing Selected Portions of a Digital Integrated Circuit," U.S. patent application Ser. No. 10/936,213 referenced above illustrates a preferred method of marking the circuit to produce a smaller optimization problem, at the same time giving the tuner maximum flexibility to improve the circuit's performance.

Before the tuner can be invoked, there is another step, that of generating design and library constraints (box 315). These are constraints whose general goal is to keep the optimizer in the fixed-cell region of FIG. 5 during continuous optimization such that "binning errors" are minimized. The final goal after tuning in a continuous space is to map the cells back to a fixed-cell library, a procedure called "binning." Since the tuner finds an optimum solution by mathematical methods, the "binning" procedure invariably causes a loss of performance. The constraints generated in box 315 are a pro-active step to minimize the potential loss of performance due to a (yet-to-be-performed) binning step. One example of a design constraint is that the input loading capacitance at each primary input must be maintained at its starting value, so as not to unduly load the macro from which that input arrives. An example of a library constraint is a constraint is an upper bound on PPW or PNW to reflect the range of cell sizes available in the fixed-cell library. Another example of a library constraint is a beta ratio constraint (i.e., upper or lower bound on the PFET to NFET strength ratio) in order to stay within the range of beta ratios available in the fixed-cell library. It may also be desirable to have a constraint on the total area of the macro, often represented by the total tunable transistor width. Design projects will often impose slew (rise/fall time) limits so as to prevent noise problems.

To make the generation of the design and library constraints efficient, the tuner preferably accepts these constraints on a cell-type basis. In other words, a certain specified constraint is automatically and efficiently applied to all instances of a specified cell type.

Once the constraints have been generated, the next step is to carry out the actual circuit tuning (box 350). Since the circuit to be tuned now consists of parameterized cells, the parameters controlling the transistor sizes of the tunable cells are treated as tunable parameters. In other words, the ratio-ing inherent in parameterized cells is respected during the tuning. Between the marking step in box 345 and the use of parameterized cells, the size of the optimization problem is vastly reduced and therefore the mathematical continuous transistor-level tuner can complete a high-quality tuning run in a practical amount of run time (practical usually implies a run time that can be accomplished in an overnight computer run). If the input design is hierarchical, it is flattened to the gate-level at this stage so as to improve the chances of obtaining performance improvement from the tuner. Although it is not shown in FIG. 3, a timing report is generated before and after the tuning step and placed in the database of box 325. These reports, in conjunction with some simple report-comparison scripts (box 325), help in auditing exactly which steps resulted in performance improvements and which did not.

Since a mathematical optimizer is employed in box 350, there is considerable flexibility in choosing the objective function of the optimizer. For example, the worst path delay of the circuit could be minimized subject to area and other constraints. Or the total transistor width of the circuit could be minimized subject to delay and other constraints. In the case when delay is minimized, the optimizer tends to try to improve the most critical path or paths to the exclusion of other paths. This behavior is not conducive to obtaining global timing convergence at the next higher level of hierarchy, such as at the unit-level or chip-level. Rather, it is beneficial to try to improve the timing of all paths that can potentially cause timing problems. The preferred method of formulating an objective function in this manner is taught in the co-pending application D. J. Hathaway, C. Visweswariah, P. M. Williams, J. Zhou, "Method of Achieving Timing Closure in Digital Integrated Circuits by Optimizing Individual Macros," U.S. patent application Ser. No. 10/435,824 referenced above, in which a mode of tuning called "Total Positive Slack" (or TPS mode) is employed. The benefit of such a formulation of the objective function is that in addition to critical path delays, sub-critical path delays are also improved, making assertion updating easier and global timing convergence quicker.

Once the results of the tuning have been obtained, the true identity of the critical paths are known and multiple threshold devices can now be re-inserted to improve the performance and leakage power characteristics of the macro. This procedure is facilitated if the library consists of sets of equivalent cells that are identical except for containing all transistors of a different type (e.g., low Vt, regular Vt or high Vt). In such a situation, an entire gate can be swapped for another gate with a different type of transistors, but equivalent size, logical function and layout. There are two parts to the re-insertion of multiple threshold devices. On the critical paths, low threshold voltage devices are inserted in such a way as to improve the delay of the critical path as much as possible. If more than one threshold level is available which is lower than the regular threshold level at which the circuit was tuned, the threshold level closest to the regular threshold level is used preferentially, where it will provide sufficient improvement to meet timing requirements, with threshold levels farther from the regular threshold level being used with decreasing frequency. There are several well-known techniques for substituting low threshold voltage devices for regular threshold voltage devices in order to improve the performance of the macro, while keeping a limit on the total transistor width of the low threshold voltage transistors in order to limit the amount of leakage power of the macro. The second part of the re-insertion is substitution of high threshold voltage devices for regular threshold voltage devices. If the signal driven by a gate is nowhere near being timing-critical, and if the gate handily meets its slew limit, it is a good candidate for high threshold voltage substitution. The substitution reduces the leakage power of the macro, and since the gate is far from critical in a timing sense, the increase in gate delay does not have any impact on the timing characteristics of the overall macro. If more than one threshold level is available which is higher than the regular threshold level at which the circuit was tuned, the highest threshold level which will provide sufficient drive strength to meet timing requirements is used preferentially in each case. Methods for such substitutions are well-known in the literature [see M. Ketkar and S. S. Sapatnekar, "Standby power optimization via transistor sizing and dual threshold voltage assignment," Prof. International Conference on Computer-Aided Design (ICCAD), San Jose, Calif., pages 375–378, November 2002 and W. Liqiong, C. Zhanping, M. Johnson, K. Roy and V. De, "Design and optimization of low-voltage high-performance dual-threshold CMOS circuits," Proc. 1998 Design Automation Conference, San Fransisco, Calif., pages 489–494, June 1998].

Since insertion of multiple threshold devices will alter the timing characteristics of the macro from those assumed in the preceding tuning process, an optional step (not shown) of retuning the macro with the multiple threshold devices in place may now be performed to further optimize the sizes of transistors. This retuning may also be done repeatedly, between iterations of mapping to a lower threshold only a subset of the transistors required to meet timing requirements, and mapping to a higher threshold only a subset of those transistors which can be so mapped. Because of the additional processing time required to repeat the tuning step, the retuning step is often skipped, or is exercised only during what is expected to be the final pass of the design process.

Other device type substitutions such as selection between alternative gate insulator thicknesses may also have effects on gate performance, leakage, and other characteristics of interest. Substitution between different alternatives in these spaces may be handled in a manner similar to the multiple threshold processing described above. Specifically, in step 340 the value of each such device type parameter may be set to its "regular" value for each gate, and a gate with all its device type parameters set to their regular values will be considered a "regular" gate. The tuning may then be performed with the parameter at this regular value, and in step 350, after continuous tuning, an alternative device type (i.e., a non-regular value for one or more of its device type parameters) may be assigned to selected gates.

At this stage, we have an optimized circuit consisting of parameterized cells, and some low threshold voltage and some high threshold voltage gates. One option would be to treat this as a final circuit and proceed to physical design. However, the problem is that each parameterized cell defines its own unique transistor sizes, and therefore requires its own unique layout. Although these unique layouts could be generated by automated techniques, one problem is that of explosion of data volume in representing and manipulating the chip design. The second problem is that various downstream software tools in the random logic macro design flow expect the circuit to consist of a collection of fixed cells. For these reasons, the parameterized cells are typically mapped back to members of the fixed cell library (box 355), a procedure called "binning." The mapping is a simple procedure. It takes as input the gate library table (box 320) which is a table containing the type and sizes of all cells in the fixed cell library. Each parameterized cell in the tuned circuit is matched to a fixed cell with the same logical function and the closest available size. For example, the sum of the squares of the differences in transistor sizes between the fixed cell and the parameterized cell can be used a measure to be minimized while mapping the parameterized cells back to a fixed cell library. Once this mapping is complete, the design once again consists of a collection of members of the fixed cell library, and hence looks like a familiar random logic macro for the purposes of all the downstream software tools in the design methodology.

The next step is to invoke transistor-level timing (box 360) on the tuned and re-mapped circuit. The timing report is again stored in the database for auditing and comparison purposes. By comparing this timing report to the previous one from box 350, for example, the exact nature and magnitude of timing differences due to "binning errors" can be determined. If the binning errors are large, for example, the constraint generation in box 315 could be revisited to generate tighter constraints, or a richer fixed-cell library may be considered.

Out of the transistor-level timing (box 360) a "Timing Abstract" (box 365) is developed, which is a macro-model that represents the timing behavior of the entire macro. The abstract feeds into global timing (box 330) which helps to judge whether the tuning improvements on the particular macro that has been tuned thus far help to meet timing budgets at the next level up in the hierarchy, such as unit-level design or chip-level design. If the timing is acceptable, the design flow continues with the physical design steps (boxes 370 to 385). Otherwise, some amount of re-design is necessary. The simplest re-design at this stage is to apportion delay differently between macros, which would result in updated assertions (box 310). Depending on the severity of the changes in the assertions, the synthesis step could be repeated (box 335), or just the tuning steps could be repeated (boxes 345 to 365). The TPS mode of tuning helps by reducing the delay of sub-critical paths, thereby making the delay-apportionment problem easier and accelerating overall timing convergence.

The next step in the design flow is to enter physical design. Since the imported design data in box 335 typically comes from a physical synthesis tool, placement information is already available for the various gates. But the sizes of gates have been changed by the tuner, so the placement may have to be adjusted slightly to make place for the gates that grew larger during tuning and take advantage of the space released by gates that became smaller. This change of placement to accommodate size changes is preferably carried out by an incremental "Engineering Change" (EC) placement. The placement update could also be carried out from scratch, but then the estimated wire parasitics could change drastically, causing unwanted timing changes.

The rest of the physical design flow is shown in FIG. 3 for completeness. The routing step (box 375) completes the detailed connections between gates to completely wire the design with various levels of metal wires. Each logic gate is replaced by its physical design (or layout) view in box 380 to fully assemble the detailed layout of the macro. Once the physical design is complete, it goes through checking (box 385) to make sure no physical or electrical design rules have been violated. The electrical parasitics of the layout are also extracted to create a detailed model of the transistors and the wires that corresponds to the physical layout. This detailed model is timed in a final transistor-level timing run (box 390), using the updated version of the assertions if necessary. The resulting timing report is placed in the timing report database (box 325) for comparison, audit and debugging purposes. The timing abstract coming out of the transistor-level timing is now the most physically-aware and accurate picture of the timing of the macro and is used to update the abstract that feeds into global timing at the next level up in the hierarchy (unit-level or chip-level).

It is to be understood that one of ordinary skill in the art can use these teachings in a variety of ways to customize the inventive design methodology. Certain steps could be skipped, or certain other steps iteratively repeated till the required result is obtained, or certain other steps invoked in a different order. At certain steps of the design, gate-level timing can be used instead of transistor-level timing if sufficiently accurate delay models are available for the fixed library cells used. Or a mixed-level timing analysis may be performed in which gate level models are used for those gates which are not expected to be close to timing-critical (e.g., based on a timing analysis at an earlier design stage, or on a complete gate-level timing analysis), and transistor-level delay modeling is performed for those gates which are expected to be close to timing-critical. It is also possible to perform the marking before mapping to parameterized cells, and then mapping only tunable gates to their parameterized cell equivalents.

What is claimed is:

1. A method of tuning a digital design comprising the steps of:
    a) mapping at least one gate of said digital design to a parameterized cell;
    b) generating constraints to keep said at least one mapped gate within a range of sizes close to sizes of available fixed library cells;
    c) tuning said digital design in a continuous space subject to said constraints, wherein said tuning comprises Total Positive Slack mode (TPS mode) tuning; and
    d) binning the at least one said gate of said digital design to a fixed library cell.

2. The method of claim 1, further comprising the step of assigning alternative device types to gates of said design.

3. The method of claim 2, wherein said parameterized cells are distinguished from gates of said alternative device type by at least one of threshold voltage and gate insulator thickness.

4. The method of claim 2, wherein said mapping comprises setting a threshold voltage for said at least one gate to a selected value.

5. The method of claim 2, wherein said mapping comprises setting an oxide thickness for said at least one gate of said digital design to a selected value.

6. The method of claim 1, wherein said tuning is applied to gates of said design which are most timing-critical.

7. The method of claim 6, wherein said tuning is further applied to gates of said design which are least timing-critical.

8. The method of claim 6, wherein identification of said timing-critical gates comprises an initial transistor-level static timing analysis.

9. The method of claim 1, wherein said generated constraints include bounds on beta ratios of gates.

10. The method of claim 1, wherein said generated constraints include bounds on a size parameter of transistors.

11. The method of claim 1, further comprising the steps of:
   a) performing a final static timing analysis; and
   b) generating a timing abstract of said digital design.

12. The method of claim 1, wherein said digital design is a random logic macro portion of a higher level digital design.

13. The method of claim 1, wherein said tuning step is repeated subsequent to said assigning step.

14. The method of claim 13, wherein said tuning and assigning steps are repeated, and wherein each repetition of said assigning step assigns an alternative device type to additional gates of said digital design.

15. The method of claim 1, wherein said binning step comprises determining an element of a fixed library whose parameters are closest to those of said at least one gate.

16. A program storage device of claim 15 readable by a machine, tangibly embodying a program of instructions executable by said machine to perform method steps for tuning a digital design, said method steps further comprising assigning alternative device types to gates of said ditital design.

17. A program storage device readable by a machine, tangibly embodying a program of instructions executable by said machine to perform method steps for tuning a digital design, said method steps comprising:
   a) mapping at least one gate of said digital design to a parameterized cell;
   b) generating constraints to keep said at least one mapped gate within a range of sizes close to sizes of available fixed library cells
   c) tuning said digital design in a continuous space subject to said constraints, wherein said tuning comprises Total Positive Slack mode (TSP mode) tuning; and
   d) binning the at least one said gate of said design to a fixed library cell.

* * * * *